United States Patent

Tamba et al.

Patent Number: 5,679,971
Date of Patent: Oct. 21, 1997

[54] SEMICONDUCTOR INTEGRATED CIRCUIT

[75] Inventors: Yuko Tamba, Ohme; Akihiro Nagatani, Ogose-machi; Takao Okazaki, Hamura, all of Japan

[73] Assignees: Hitachi, Ltd., Tokyo; Hitachi Tohbu Semiconductor, Ltd., Saitama, both of Japan

[21] Appl. No.: 505,459

[22] Filed: Jul. 21, 1995

[30] Foreign Application Priority Data

Jul. 21, 1994 [JP] Japan ................... 6-191010

[51] Int. Cl.$^6$ ................ H01L 29/06; H01L 29/78
[52] U.S. Cl. ................ 257/357; 257/360; 257/369
[58] Field of Search ................... 257/356, 357, 257/360, 355, 369

[56] References Cited

U.S. PATENT DOCUMENTS

| | | | |
|---|---|---|---|
| 5,426,323 | 6/1995 | Reczek et al. | 257/360 |
| 5,514,893 | 5/1996 | Miyanaga et al. | 257/360 |

FOREIGN PATENT DOCUMENTS

| | | | |
|---|---|---|---|
| 50-36154 | 11/1975 | Japan | 257/355 |
| 4-68575 | 3/1992 | Japan | 257/355 |
| 4-94568 | 3/1992 | Japan | 257/355 |

OTHER PUBLICATIONS

Kalter, "Semiconductor Chip Pad Protect Device" IBM TDB vol. 15 No. 12, May 1973, pp. 3753-3754.

*Primary Examiner*—Donald Monin
*Attorney, Agent, or Firm*—Antonelli, Terry, Stout & Kraus, LLP.

[57] ABSTRACT

In a semiconductor integrated circuit having a plurality of electronic circuits each provided with interfaces used for effecting signal transmission, and supplied with operating voltages from a plurality of independent power supply terminals, protective elements each having high threshold voltages at which the elements are off in the ordinary state of power supply are provided, and a resistor and a diode both for preventing electrostatic breakdown are connected to the gate of an input MOSFET of the interface for carrying out signal transmission between the electronic circuits. Even when a high voltage due to static electricity is applied to each power supply terminal while the semiconductor integrated circuit is handled, electrostatic breakdown of the interface can be prevented by the protective element or the electrostatic breakdown preventive circuit comprising a resistor and a diode.

9 Claims, 10 Drawing Sheets

SEMICONDUCTOR INTEGRATED CIRCUIT

BACKGROUND OF THE INVENTION

The present invention relates to a semiconductor integrated circuit, and a technology effectively utilizable for a semiconductor integrated circuit having a plurality of electronic circuits each supplied with power from a plurality of power supply terminals.

The electrostatic breakdown of a semiconductor integrated circuit is caused by electrostatic discharge arising while the semiconductor integrated circuit is handled or after it is mounted on a printed circuit board. Such breakdown includes gate oxide film breakdown, junction breakdown, and wiring fusing of a MOSFET (MOSFET is used to refer to an insulated gate field effect transistor in the present application for patent). A portion which is least resistant to these three main causes determines the electrostatic breakdown voltage of the semiconductor integrated circuit. In order to cope with the electrostatic breakdown, there have heretofore been contrived circuit arrangements against the gate oxide film breakdown so that no voltage exceeding the breakdown voltage is applied directly to the gate oxide film in the semiconductor integrated circuit even when a high voltage is applied thereto. For example, a resistor for a signal line is connected between a pad (external terminal) and the interior of the semiconductor integrated circuit, diodes are inserted between the signal line and a power supply and between the signal line and GND, and, for the junction breakdown, the layout pattern in view of the junction area, the contact arrangement and so forth is contrived. For the wiring fusing, further, wiring width enlarging method has been employed. Japanese Patent Publication No. 36154/1975 discloses the technology of the countermeasure of the aforementioned electrostatic breakdown.

SUMMARY OF THE INVENTION

The present inventors have adopted a system in which when a semiconductor integrated circuit including analog and digital circuits in combination is developed, these circuits are each supplied with power from independent external terminals to prevent switching noise from being introduced from the digital circuit to the analog circuit via the ground potential of the power supply line or circuit. The present inventors have encounter a phenomenon that the internal circuit malfunctions when such a semiconductor integrated circuit is subjected to electrostatic breakdown test using a Human Body Model (HBM) method. A detailed investigation into the cause of the malfunction of the internal circuit has revealed that the breakdown of the gate insulating film of the input MOSFET occurs at the interface between the digital and analog circuits or analog and digital circuits.

Figure 13A:
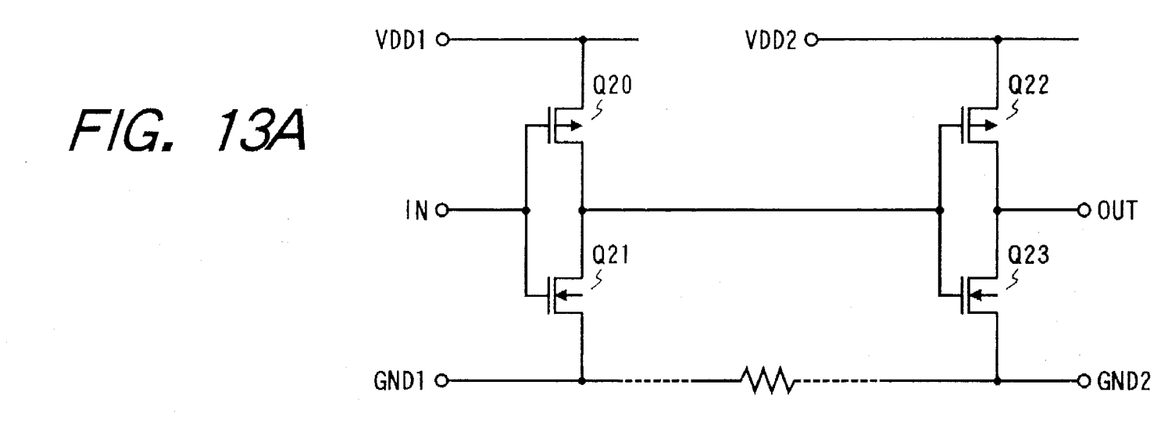
FIGS. 13A and 13B are structural views for illustrating problems to be solved by the present invention.
Figure 13B:
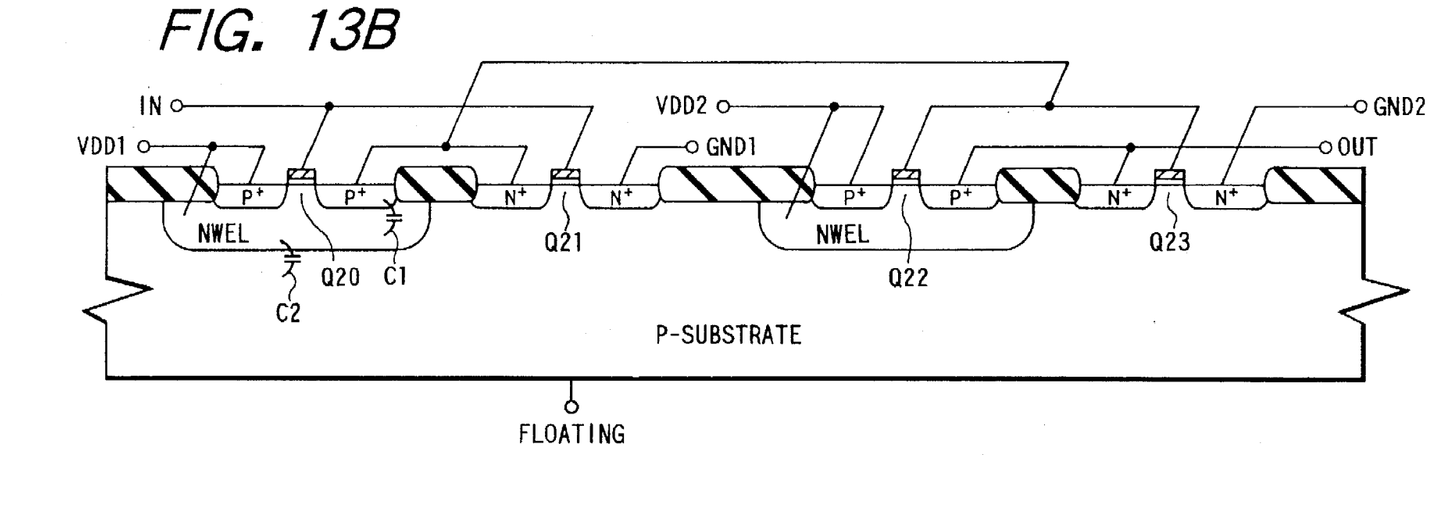

Referring to FIGS. 13A, 13B, a detailed description will be given of the aforementioned breakdown. FIG. 13A shows an interface between independent power supply terminals (VDD1, VDD2). The interface comprises a P-channel output MOSFET Q20, an N-channel output MOSFET Q21, a P-channel input MOSFET Q22, an N-channel input MOSFET Q23, and wiring for use as a signal transmission path for connecting the commonly connected drains of the output MOSFETs Q20, Q21 and the gates of the input MOSFETs Q22, Q23. When the power supply terminal VDD1 is, for example, for the digital circuit (or analog circuit), the power supply terminal VDD2 is for the analog circuit (or digital circuit).

FIG. 13B is a schematic element structural sectional view of the interface. For example, an overvoltage (say, 1,000 V), compared with a reference voltage of VDD2, due to static electricity is applied to the VDD1 while ground potentials GND1 and GND2 of the circuit are open, the parasitic capacitance C1 between a well NWEL where the MOSFET Q20 is formed and the drain, and the parasitic capacitance C2 between the well NWEL and a substrate (P-SUBSTRATE) cause the voltages of the wiring as the signal transmission path and the substrate to rise. Therefore, an overvoltage is applied to the gate oxide film of the P-channel input MOSFET Q22 and causes the electrostatic breakdown of the film. Moreover, the gate oxide film of the N-channel input MOSFET Q23 also breaks down likewise when an overvoltage with respect to the potential GND2 is applied to the VDD1 in the state that the VDD2 and GND1 are open.

An object of the present invention is to provide a reliable semiconductor integrated circuit.

These and other objects and novel features of the present invention will be become manifest upon making reference to the detailed description which follows and the accompanying sheets of drawings.

In a semiconductor integrated circuit embodying the present invention comprising a plurality of electronic circuits which are provided with interfaces for effecting signal transmission, and supplied with operating voltages from a plurality of independent power supply terminals, unidirectional elements each having a high threshold voltage so that the elements are off in a normal power supply state are provided between the corresponding power supply terminals.

By use of the aforementioned means, the input MOSFET of the interface is protected even when a high voltage due to static electricity is applied to power supply terminals while handling the semiconductor integrated circuit because the power supply terminals are discharged by the unidirectional elements.

In another semiconductor integrated circuit embodying the present invention comprising a plurality of electronic circuits which are provided with interfaces for effecting signal transmission, and supplied with operating voltages from a plurality of independent power supply terminals, a resistor and a diode both for preventing electrostatic breakdown are connected to the gate of the input MOSFET of the interface for transmitting a signal between electronic circuits.

By use of the aforementioned means, the gate of the input MOSFET of the interface is prevented from breakdown by the electrostatic breakdown preventive circuit including the resistor and the diode even when a high voltage due to static electricity is applied to power supply terminals while the semiconductor integrated circuit is handled.

Still another semiconductor integrated circuit embodying the present invention comprises a semiconductor substrate, a first and a second circuit formed on the semiconductor substrate, a first power supply terminal formed on the semiconductor substrate and used for supplying a first operating voltage to the first circuit, a second power supply terminal formed on the semiconductor substrate and used for supplying a second operating voltage to the second circuit, and a protective element formed on the semiconductor substrate between the first and second power supply terminals, wherein the protective element has a threshold voltage higher than the first and second operating voltages.

Still another semiconductor integrated circuit embodying the present invention comprises a semiconductor substrate, a first and a second circuit formed on the semiconductor substrate, a first power supply terminal formed on the semiconductor substrate and used for supplying a first operating voltage to the first circuit, a second power supply terminal formed on the semiconductor substrate and used for supplying a second operating voltage to the second circuit, first power supply wiring connected to the first power supply terminal and extended in the first circuit, first reference potential wiring extended in the first circuit, second power supply wiring connected to the second power supply terminal and extended in the second circuit, second reference potential wiring extended in the second circuit, a first and a second MOSFET connected in series between the first power supply wiring and first reference potential wiring in the first circuit, a third and a fourth MOSFET connected in series between the second power supply wiring and the second reference potential wiring in the second circuit, and a signal wiring connected to the first, second and fourth MOSFETs and used for transmitting an output signal of the first circuit to the second circuit, wherein the first and second power supply wirings are electrically independent of each other on the semiconductor substrate, and a resistor element is arranged in part of the signal wiring.

Still another semiconductor integrated circuit embodying the present invention comprises a semiconductor substrate, a first and a second circuit formed on the semiconductor substrate, a first power supply terminal formed on the semiconductor substrate and used for supplying a first operating voltage to the first circuit, a second power supply terminal formed on the semiconductor substrate and used for supplying a second operating voltage to the second circuit, first power supply wiring connected to the first power supply terminal and extended in the first circuit, first reference voltage wiring extended in the first circuit, a second power supply wiring connected to the second power supply terminal and extended in the second circuit, second reference potential wiring extended in the second circuit, a first and a second MOSFET connected in series between the first power supply wiring and a first reference potential wiring in the first circuit, a third and a fourth MOSFET connected in series between the second power supply wiring and the second reference potential wiring in the second circuit, and a signal wiring connected to the first, second and fourth MOSFETs and used for transmitting an output signal of the first circuit to the second circuit, wherein the first and second power supply wirings are electrically independent of each other on the semiconductor substrate and a protective element connected between the signal wiring and the second reference potential wiring and used for preventing the breakdown of the fourth MOSFET when overvoltage is applied to the signal wiring.

DESCRIPTION OF THE PREFERRED EMBODIMENT

Figure 12:
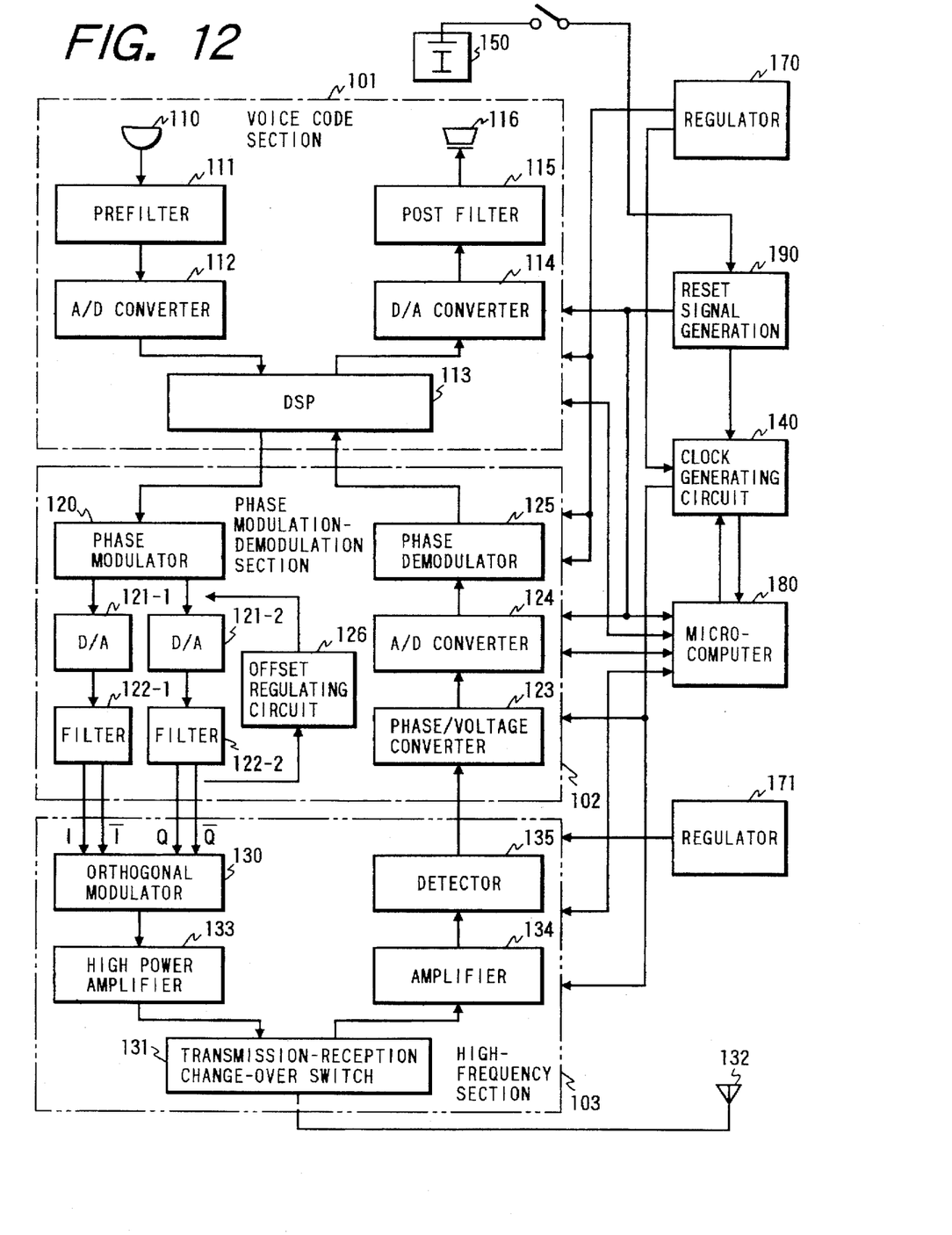
FIG. 12 is a block diagram of a portable communication terminal containing a semiconductor integrated circuit according to the present invention.

FIG. 12 is a block diagram of an embodiment of a portable communication terminal containing a semiconductor integrated circuit to which the present invention is applied. This portable communication terminal according to the present invention is mainly made up of a voice code section, a phase modulation-demodulation section, a high-frequency section, a microcomputer for controlling the sections and so forth. The semiconductor integrated circuit to which the present invention is applied constitutes the phase modulation-demodulation section in the portable communication terminal.

The portable communication terminal of the embodiment comprises a voice coding-decoding section (hereinafter referred to as voice coding section) 101, a phase modulation-demodulation section 102 and a high-frequency section 103. The operation order of these sections 101–103, the activation and deactivation of the circuits are controlled by signals or pulses from a microcomputer 180, a reset signal generating circuit 190 and a clock generating circuit 140. Further, power is supplied from regulators 170, 171 to the voice coding section 101, the phase modulation-demodulation section 102 and the high-frequency section 103. In this case, particularly the independent regulator 171 is used for the high-frequency section 103 in consideration of the burst operation and the like.

The phase modulation-demodulation section 102, an example of the semiconductor integrated circuit to which the present invention is applied, has a mixture of digital and analog circuits, and is formed into one semiconductor integrated circuit. In other words, in one chip, a digital section for processing digital signals comprising a phase modulator 120 and a phase demodulator 125, and an analog section for processing analog signals comprising D/A converters 121-1, 121-2 (hereinafter referred to as D/A), filters 122-1, 122-2, an A/D converter 124, a phase/voltage converter 123, and an offset regulating circuit 126.

The voice encoding section 101 includes a prefilter 111 for suppressing a high-frequency noise component out of the transmitted analog voice signal fed from a microphone 110, an A/D converter 112 for converting the output of the prefilter 111 to a digital signal, a DSP (digital signal processor) 113 for compressing the frequency band of the output of the A/D converter 112 by processing the digital signal or conversely for expanding the band-compressed digital voice signal thus received to the original band width, a D/A converter 114 for converting the output thus band-expanded by the DSP 113 to an analog voice signal, a post-filter 115 for suppressing the high-frequency components contained in the output of the D/A converter 114 and amplifying the output thereof, and a speaker 116 which is driven by the output of the post filter 115.

The phase modulation-demodulation section 102 includes a phase modulator 120 for subjecting the signal output from the DSP 113 to modulation suitable for radio communication, for example, Gaussian Minimum Shift Keying (GMSK) modulation or π/4-Shift QPSK modulation, D/A converters 121-1, 121-2 for converting the output of the phase modulator 120 to an analog signal, post-filters 122-1, 122-2 for suppressing the high-frequency components contained in the outputs of the post-filters 122-1, 122-2, a phase/voltage converter 123 for conversely detecting the phase shift contained in the received modulation signal and converting the phase shift to voltage, an A/D converter 124 for converting the output of the phase/voltage converter 123 to a digital signal, and a phase demodulator, 125 for demodulating the original fundamental signal component from the output the A/D converter 124. An offset regulating circuit 126 is providing for regulating the offset generated between the D/A converters 121-1, 121-2 and the filters 122-1, 122-2.

A plurality of sets of a phase modulator 120, D/A converters 121-1, 121-2 and post-filters 122-1, 122-2 are parallely provided in accordance with the system configuration to output a positive-phase signal and a negative-phase signal respectively or signals having phases 90° different from each other, that is, signals whose phases are orthogonal to each other.

The high-frequency section 103 includes an orthogonal modulator 130 for modulating the signals output from the post-filters 122-1, 122-2 with a radio-frequency carrier signal having a frequency of, for example, about 800 MHz to 2 GHz, a high power amplifier 133 for amplifying the output of the orthogonal modulator 130 up to predetermined transmission power and exciting an antenna 132 via a transmission-reception change-over switch 131, and a detector 135 for detecting a desired signal from the output of the antenna 132 and its amplifier 134.

The orthogonal modulator 130 may have, in accordance with the system configuration, a plurality of stages for effecting modulation with a relatively low frequency of, for example, 455 KHz or 90 KHz, and effecting modulation with a radio-frequency carrier signal of a predetermined frequency of about 800 MHz to 2 GHz.

Figure 1:
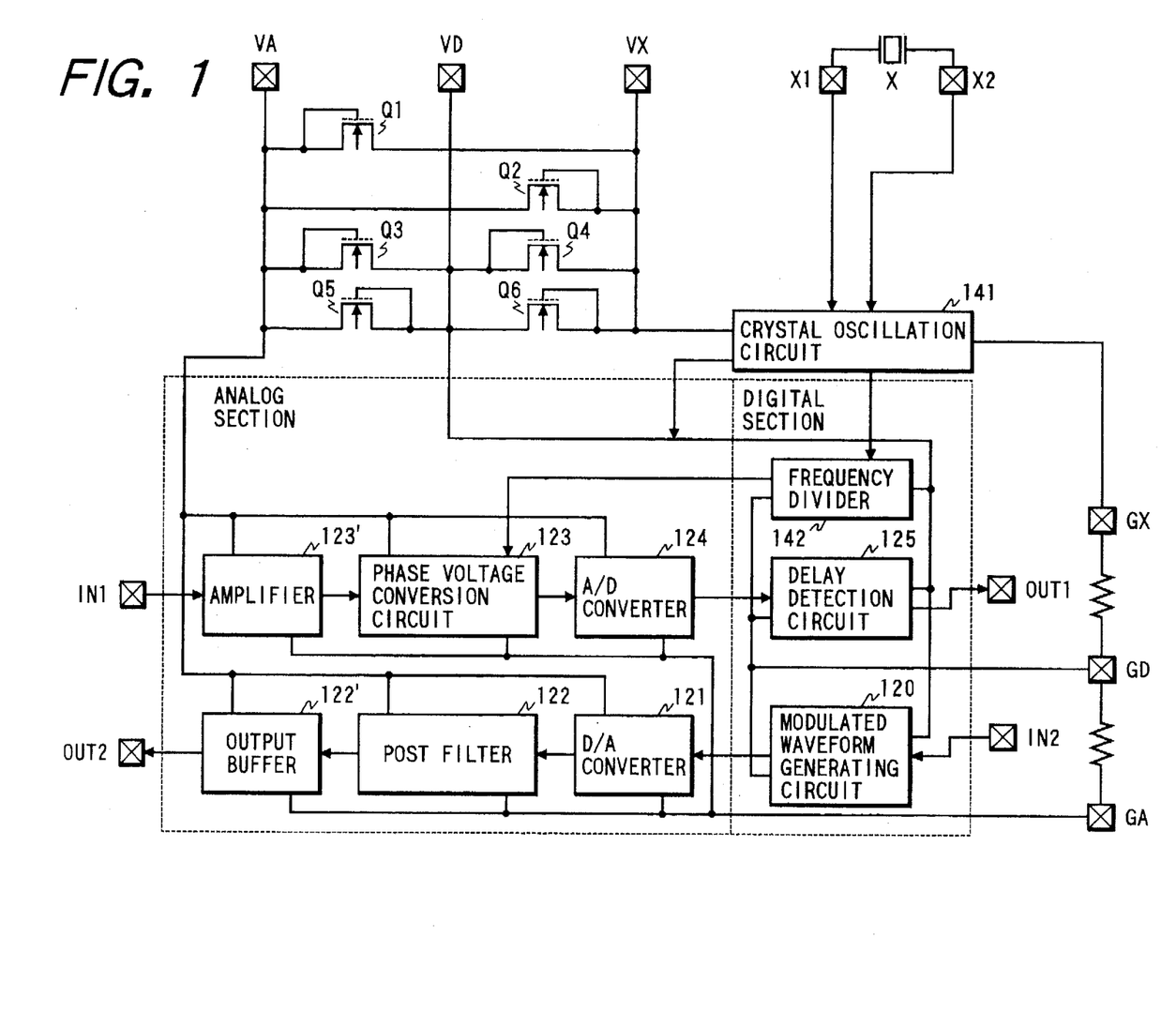
FIG. 1 is a block diagram of a semiconductor integrated circuit embodying the present invention.

FIG. 1 is a block diagram of a semiconductor integral circuit embodying the present invention. The semiconductor integrated circuit shown in FIG. 1 is a digital/analog mixed LSI and constitutes the phase modulation-demodulation section 102 of FIG. 12.

A modem LSI for a portable communication terminal of this embodiment of the present invention has the following three independent power supply terminals to avoid noise interference in the analog part from the digital part and a crystal oscillation circuit. An analog power supply terminal VA supplies an operating voltage via power supply wiring on a semiconductor substrate to an amplifier 123', a phase/voltage conversion circuit 123, an A/D converter 124, a D/A converter 121, a post filter 122 and an output buffer 122'. A digital power supply terminal VD supplies an operating voltage via power supply wiring on the semiconductor substrate to a frequency divider 142, a delay detection circuit 125 and a modulated waveform generating circuit 120. A crystal power supply terminal VX supplies an operating voltage to a crystal oscillation circuit 141. In this case, the terminal means a bonding pad.

Correspondingly to the aforementioned power supply terminals VA, VD and VX, grounding terminals for supplying the ground potentials of the circuits are also supplied with ground potentials of the circuits via independent external terminals GA, GD and GX. In this case, the same operating voltage of 3–5 V is applied to the power supply terminal VA, VD and VX; however, the voltages to be supplied thereto may be different.

MOSFETs $Q_1$–$Q_6$ are diode-connected between the above different power supply terminals VA, VD, VX in this embodiment. These MOSFETs $Q_1$–$Q_6$ are allowed to have high threshold voltages so that they are not turned on in a normal operating state as will be described later. Use is made of, but not necessarily limited to, a thick field insulating film as a gate insulating film, that is, a so-called parasitic MOSFET. For example, a MOSFET (hereinafter referred to as N-type aluminum parasitic MOSFET) in which the gate insulating film is made up of a field insulating film and the gate is made up of an aluminum layer as state above is used.

For example, when a positive high voltage compared with the analog power supply terminal VA is applied to the digital power supply terminal, the N-type aluminum parasitic MOSFET Q5 is turned on if the applied voltage exceeds the threshold voltage of the N-type aluminum parasitic MOSFET Q5, which causes the analog power supply terminal VA to electrically connect to the digital power supply terminal VD to conduct. When a negative high voltage is applied, the N-type aluminum parasitic MOSFET Q3 is turned on, causing the analog power supply terminal VA to electrically connect to the digital power supply terminal VD. Thereby the potential different between the analog power supply terminal VA and the digital power supply terminal VD is canceled, and thus the electrostatic breakdown of the interface between the analog-digital power supplies is avoided. When a positive high voltage with respect to the potential of the digital power supply terminal VD is conversely applied to the analog power supply terminal VA, the N-type aluminum parasitic MOSFET Q3 is turned on, whereas when a negative high voltage is applied, the N-type aluminum parasitic MOSFET Q5 is turned on. Thereby the potential difference between analog power supply terminal VA and the digital power supply terminal VD is canceled.

When a positive high voltage with respect to the digital power supply terminal VD is applied to the crystal power supply terminal VX, the N-type aluminum parasitic MOSFET Q6 is turned on, whereas when a negative high voltage is applied, the N-type aluminum parasitic MOSFET Q4 is turned on. Thereby the potential difference between the digital power supply terminal VD and the crystal power supply terminal VX is canceled. When a positive-electrode high voltage with respect to the crystal power supply terminal VX is conversely applied to the digital power supply terminal VD, the N-type aluminum parasitic MOSFET Q4 is turned on, whereas when a negative high voltage is applied, the N-type aluminum parasitic MOSFET Q6 is turned on, whereby the potential difference between the digital power supply terminal VD and the crystal power supply terminal VX is canceled.

When a positive high voltage with respect to the crystal power supply terminal is applied to the analog power supply terminal VA, the N-type aluminum parasitic MOSFET Q1 is turned on, whereas when a negative-electrode high voltage is applied, the N-type aluminum parasitic MOSFET Q2 is turned on, whereby the potential difference between the analog power supply terminal VA and the crystal power supply terminal VX is canceled. When a positive high voltage with respect to the analog power supply terminal VA is conversely applied to the crystal power supply terminal VX, the N-type aluminum parasitic MOSFET Q2 is turned on, whereas when a negative high voltage is applied, the N-type aluminum parasitic MOSFET Q1 is turned on, whereby the potential difference between the analog power supply terminal VA and the crystal power supply terminal VX is canceled.

The threshold voltages of the N-type aluminum parasitic MOSFETs $Q_1$–$Q_6$ are thus utilized to cancel the potential difference between the independent power supply terminals which is the main cause of electrostatic breakdown of the interfaces between the independent power supplies, so that electrostatic breakdown of the interfaces is avoided. Although by way of example, there has been described a circuit having interfaces for the three independent power supplies namely, the interface between the analog power supply system and the digital power supply system, the interface between the crystal power supply system and the digital power supply system, and the interface between the crystal power supply system and the digital power supply system. However, the constitution of the power supply terminal, the grounding terminal and the input-output terminal is not limited as far as a plurality of independent power supplies are provided, and interfaces between the independent power supplies are provided.

With the progress of semiconductor integrated circuit technology, miniaturization of devices is under way. The breakdown voltages of MOSFETs used in internal circuits tend to become lower, and much more electronic circuits tend to be formed on one semiconductor substrate. Consequently, breakdown of the interfaces between the internal electronic circuits is considered to be a serious problem, which has been not a problem conventionally. For this reason, the present invention solves the foregoing problems.

Incidentally, it should be understood that the amplifier 123' constitutes an input buffer included in the input part of the phase/voltage converter 123 not shown in FIG. 12. Although the output buffers 122' are not shown likewise in FIG. 12, they are included in the output parts of the filters 122-1, 122-2. The rest corresponds to that of FIG. 12.

Figure 2A:
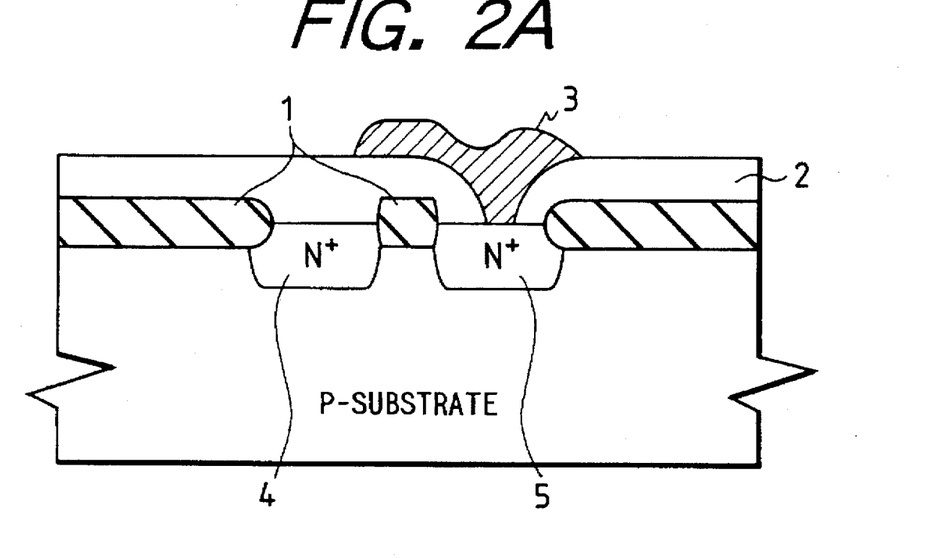
FIGS. 2A and 2B are schematic structural sectional views of an aluminum parasitic MOSFET of FIG. 1 embodying the present invention.
Figure 2B:
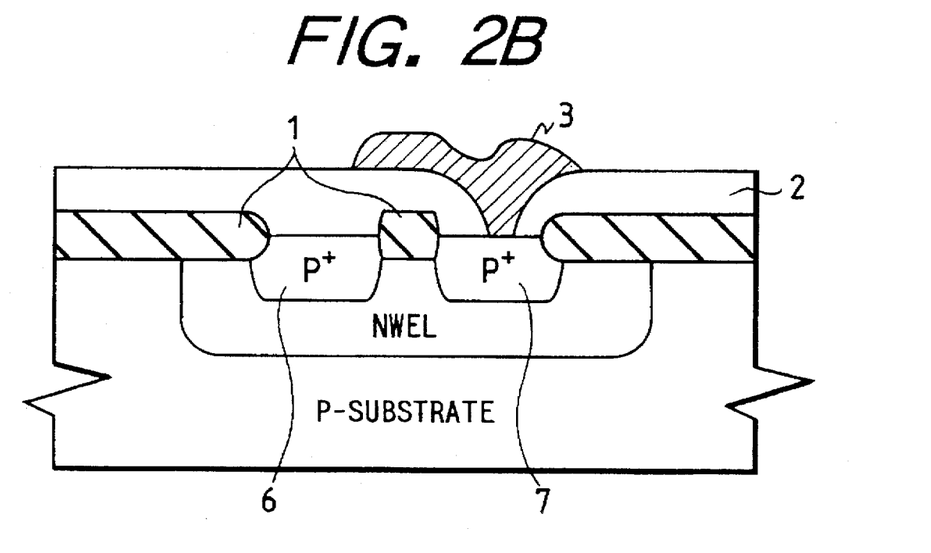

FIGS. 2A, 2B are schematic structural sectional views of the aluminum parasitic MOSFETs according to the present invention: FIG. 2A shows an N-type aluminum parasitic MOSFET; and FIG. 2B a P-type aluminum parasitic MOSFET. In the N-type aluminum parasitic MOSFET of FIG. 2A, an $N^+$ source and an $N^+$ drain are formed in a P-substrate, and an aluminum gate is formed, using a field insulating film (450–500 nm) 1 and an interlayer insulating film (400–500 nm) 2 as gate insulating films. The aluminum gate 3 is connected to a diffusion layer serving as a drain 5, forming a diode-connected FET. In the P-type aluminum parasitic MOSFET of FIG. 2B, an N-type well NWEL is formed in the P-substrate, and a $P^+$ source 6 and a $P^+$ drain 7 are formed in the NWEL, the rest being the same in structure as those of FIG. 2A. In this case, the threshold voltages of the aluminum parasitic MOSFETs is 12–15 V.

Figure 3A:
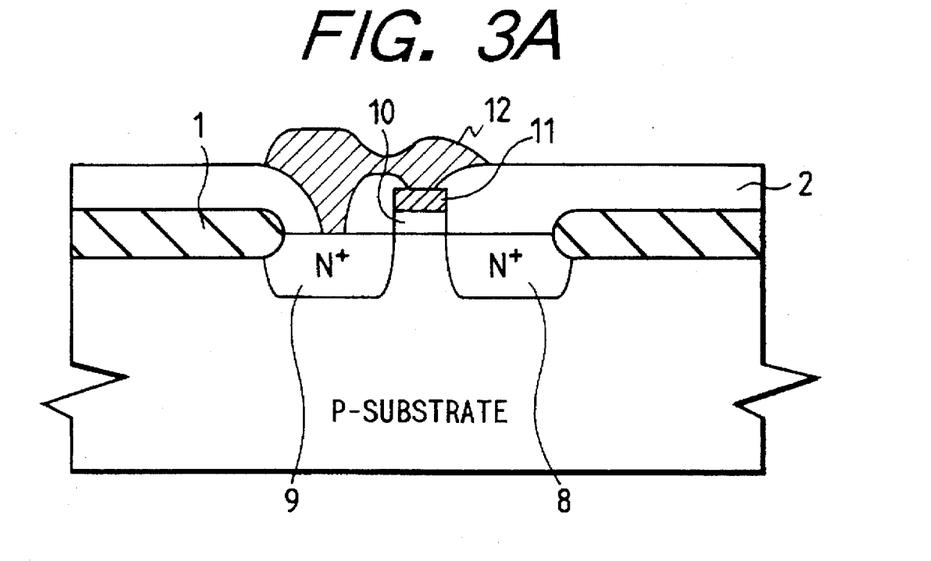
FIGS. 3A and 3B are schematic structural sectional views of another parasitic MOSFET embodying the present invention.
Figure 3B:
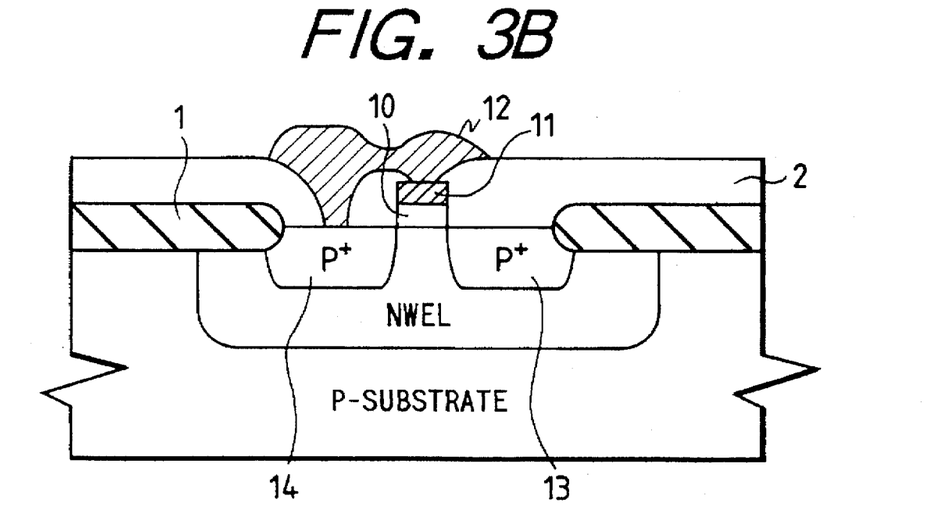

FIGS. 3A, 3B are schematic structural sectional views of other parasitic MOSFETs according to the present invention: FIG. 3A shows an N-type parasitic MOSFET; and FIG. 3B a P-type parasitic MOSFET. In order to increase the threshold voltage, the N-type parasitic MOSFET is provided with a gate oxide film 10 (about 400 nm) which is sufficiently thicker than the gate insulating film (20 nm) of an ordinary MOSFET, and formed on the P-substrate between an $N^+$ source 8 and an $N^+$ drain 9, a polysilicon gate 11 is formed on the gate oxide film 10, and the drain and the gate electrode are connected in the form of a diode by means of aluminum wiring 12. In the P-type parasitic MOSFET of FIG. 3B, an N-type well NWEL is formed in the P-substrate, and the $P^+$ source 8 and $P^+$ drain 9 are formed in the NWEL, the rest being the same in structure as those of FIG. 3A.

Figure 4A:
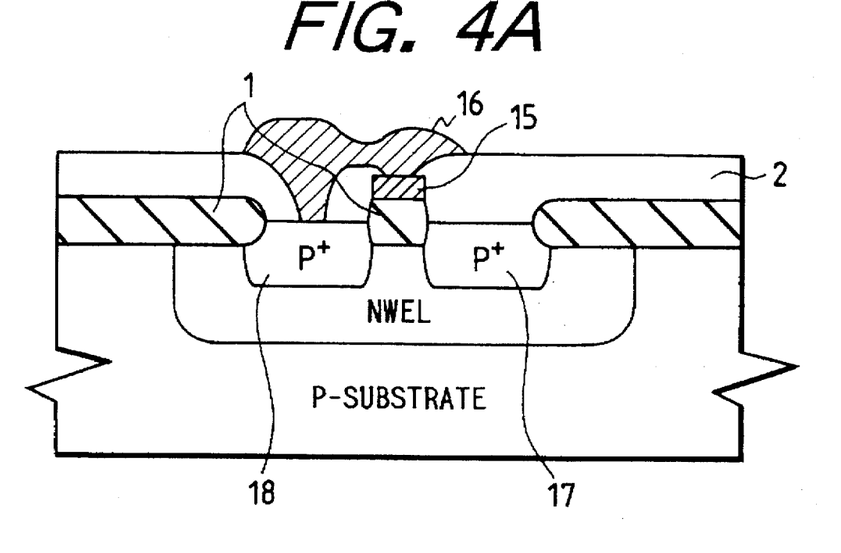
FIGS. 4A and 4B are schematic structural sectional views of still another parasitic MOSFET embodying the present invention.
Figure 4B:
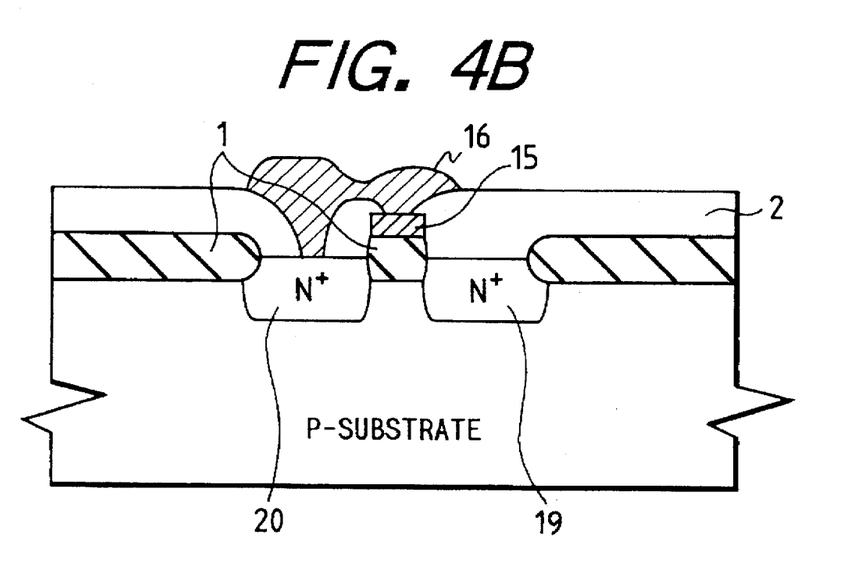

FIGS. 4A, 4B are schematic structural sectional views of still other parasitic MOSFETs according to the present invention: FIG. 4A shows a P-type parasitic MOSFET; and FIG. 4B an N-type parasitic MOSFET. In the N-type parasitic MOSFET of FIG. 4B, an $N^+$ source 19 and an $N^+$ drain 20 are formed in a P-substrate, a field insulating film (450–500 nm) 1 therebetween is utilized as a gate insulating film, and a polysilicon gate 15 is formed on the gate oxide film. Aluminum wiring 16 is used to connect the drain and the gate electrode 15 in the form of a diode. In the P-type parasitic MOSFET of FIG. 4A, the N-type well NWEL is formed in the P-substrate, and the $P^+$ source 17 and $P^+$ drain 18 are formed in the NWEL, the rest being the same in structure as those of FIG. 4B.

Although omitted in the embodiment above, the P- and N-channel MOSFETs constituting the digital and analog circuits are, unless otherwise specifically described, of ordinary LDD structure (e.g., formed by the technique disclosed in U.S. Pat. No. 4,366,613) and comprise a gate oxide film (20 nm) on the surface of a semiconductor substrate, a polysilicon gate (200 nm), source and drain region comprising high and low concentration layers. Incidentally, the threshold voltages of these P- and N-type MOSFETs are about 0.7 V. In the P- and N-type aluminum parasitic MOSFETs and the P- and N-type polysilicon parasitic MOSFETs, gates are made of aluminum and polysilicon on the field oxide film or the thick gate insulating film. The purpose is to set the absolute values of the threshold voltages of the P- and N-type parasitic MOSFETs to serve as clamp MOSs larger than the normal power supply voltage and smaller than the breakdown voltages of the gate insulating films of MOSFETs constituting the digital and analog circuits. Further, that the purpose is to hold the independent power supply during the normal operation by making use of the threshold voltage of the clamp MOS, and to operate the clamp MOS only when a great potential difference due to static electricity or the like is generated. As shown in FIGS. 2A, 2B, 3A, 3B, 4A, 4B, it is necessary for the threshold voltage to be only made greater by increasing the thicknesses of the field and the gate oxide films.

The P-type parasitic MOSFETs of FIGS. 2A, 2B, 3A, 3B, 4A, 4B are also usable in place of the N-type parasitic MOSFETs of FIG. 1. A combination of N- and P-type parasitic MOSFETs may be used likewise.

Figure 5:
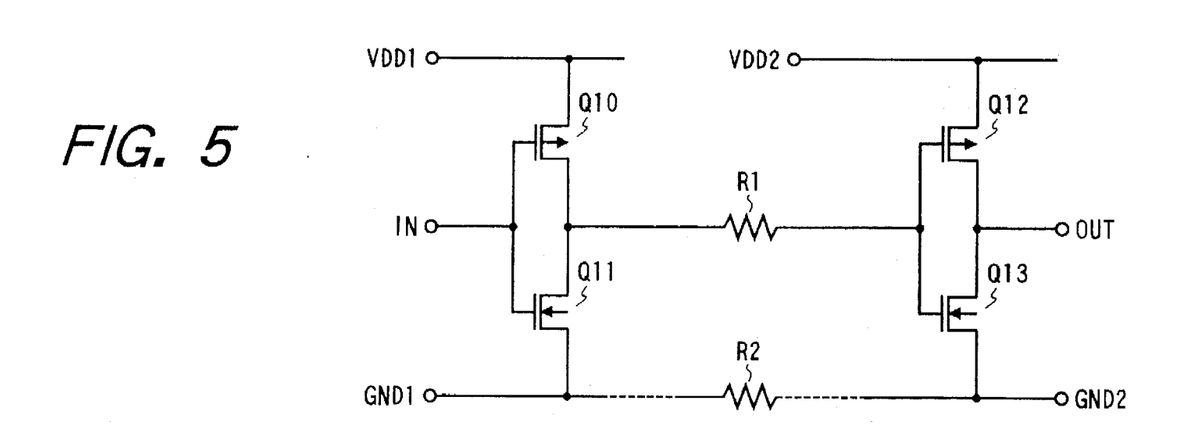
FIG. 5 is a circuit diagram of an interface in a semiconductor integrated circuit according to the present invention.

FIG. 5 is a circuit diagram of an interface in a semiconductor integrated circuit according to the present invention. Each element of FIG. 5 is formed on one semiconductor substrate of single crystal silicon through a known semiconductor integrated circuit technology. The power supply voltages VDD1 and VDD2 are each supplied from different power supply terminals. Correspondingly, the ground potentials GND1 and GND2 of the circuit are supplied from independent external terminals, as described before. However, the ground potentials GND1 and GND2 of the circuit are internally connected together via a parasitic resistor R2 formed in the semiconductor substrate, the semiconductor region or the like.

A P-channel MOSFET Q10 and an N-channel MOSFET Q11 constitute a CMOS inverter circuit as an interface output circuit; in other words, it is a circuit for generating an output signal fed to an electronic circuit which is operated by the power supply voltage VDD2, out of the electronic circuits operated by the power supply voltage VDD1. The MOSFETs Q10 and Q11 constituting such an output circuit are of LDD structure as will be described later.

In the input circuit of the interface corresponding to the output circuit above, a resistor R1 is provided in a signal transmission path to prevent the aforementioned electrostatic breakdown. This resistor R1 is constituted of a polysilicon layer or a P- or N-type semiconductor region formed in the semiconductor substrate. A P-channel MOSFET Q12 and an N-channel MOSFET Q13 constituting an input circuit are of single drain structure to prevent their electrostatic breakdown. In other words, the MOSFETs constituting the input interface circuit is of the single drain structure though the other internal circuits are of LLD structure. The channel lengths of the MOSFETs are also set greater than the channel lengths of the output MOSFETs Q10 and Q11 or of the MOSFETs of LLD structure forming the other internal circuits, whereby the MOSFETs constituting the input interface circuit is made to withstand higher voltages.

Figure 6:
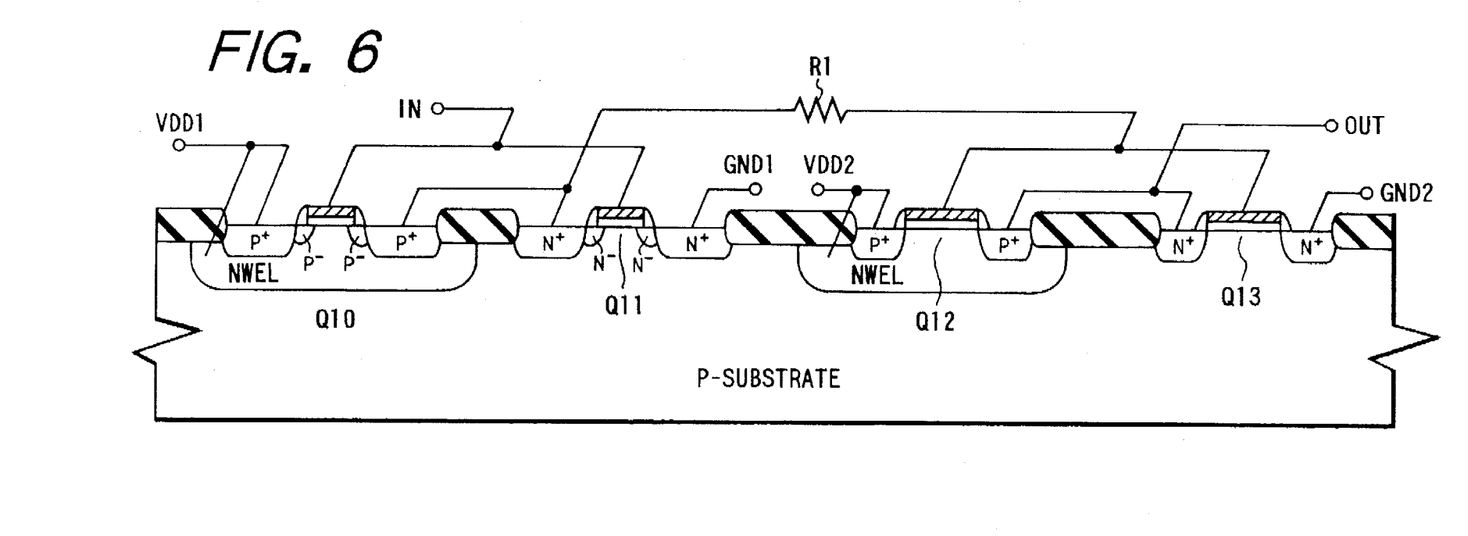
FIG. 6 is a schematic element structural sectional view of the interface of FIG. 5 according to the present invention.

FIG. 6 is a schematic element structural sectional view of the interface device according to the present invention. The P-channel MOSFET Q10 constituting the output circuit is formed in the N-type well region NWEL, whereas the N-channel MOSFET Q11 is formed in the P-type substrate. These MOSFETs Q10 and Q11 are of LDD structure and the MOSFETs constituting the internal circuit are also similar in structure to the P-channel MOSFET Q10 and the N-channel MOSFET Q11. The P-channel MOSFET Q12 constituting the input circuit is formed in the N-type well region NWEL, whereas the N-channel MOSFET Q13 is formed in the P-type substrate. These MOSFETs Q12 and Q13 are of single drain structure so as to withstand higher voltages.

For example, while the grounding lines GND1, GND2 of the circuit are open, and if a high voltage with respect to the power supply voltage VDD2 is applied to the power supply voltage VDD1, the voltage of the signal line to which the resistor R1 is connected by parasitic capacitance rises with a rise in the voltage of VDD1. On the other hand, for the input MOSFETs Q12 and Q13, a high voltage is relaxed by the resistor R1 and the parasitic capacitor. Since the MOSFET is of single drain structure, the breakdown voltage of the gate oxide film is increased by increasing the withstand voltage against the junction breakdown and the gate length.

Figure 7A:
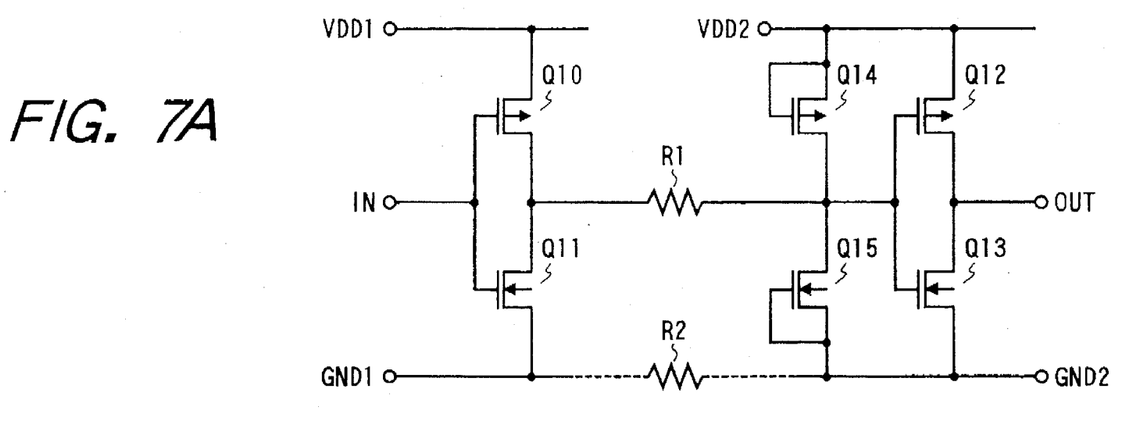
FIGS. 7A and 7B are structural views of another interface embodying the present invention.
Figure 7B:
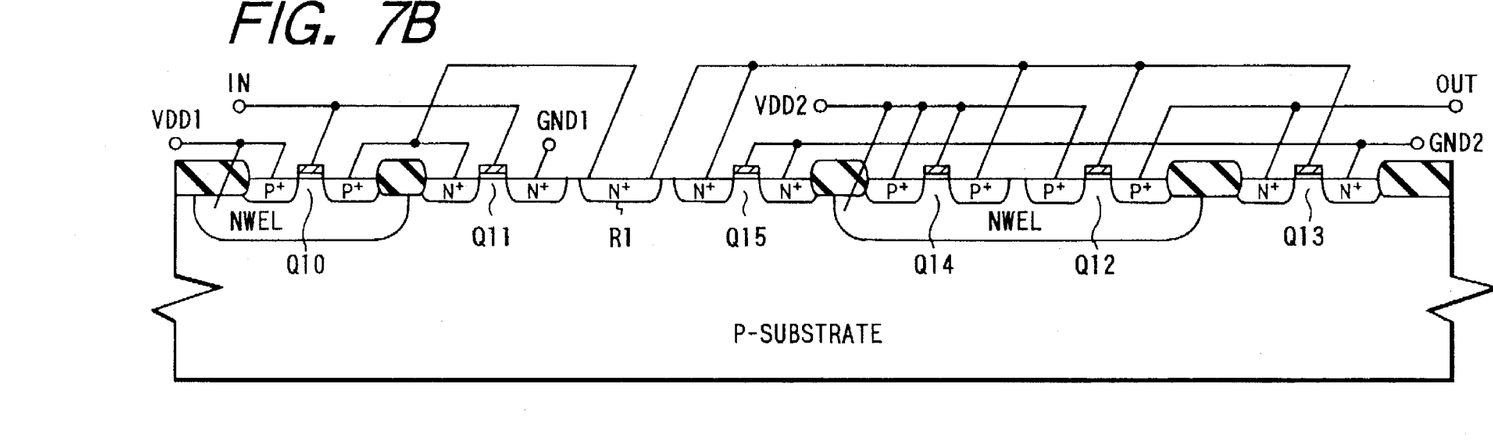

FIGS. 7A, 7B are block diagrams of another interface embodying the present invention: FIG. 7A shows an example of a circuit; and FIG. 7B a corresponding schematic structural sectional view of the circuit. The interface is formed on one semiconductor substrate of single crystal silicon through a known semiconductor integrated circuit technology.

In this embodiment of the present invention, a P-channel MOSFET Q14 in the form of a diode for clamping voltage is provided between the commonly connected gates of a P-channel MOSFET Q12 and an N-channel MOSFET Q13 constituting the input circuit and the power supply voltage VDD2. Further, a diode-connected N-channel MOSFET Q15 for clamping voltage is provided between the gate and the ground potential GND2. Moreover, a resistor R1 formed with an N⁺ diffusion layer is provided in the signal transmission line for use in transmitting a signal from the output circuit. The input MOSFETs Q12, Q13 and the MOSFETs Q14, Q15 for clamping voltage are MOSFETs of single drain structure.

For example, while the GND1, GND2 are open, and if a positive high voltage with respect to the power supply voltage VDD2 is applied to the power supply voltage VDD1, the voltage in the signal transmission path rises with a rise in the voltage of the power supply VDD1. To prevent this, a forward current is made to flow through the protective diode comprising the P-type MOSFET Q14, thereby clamping the voltage of the signal transmission path. Contrarily, when a negative high voltage is applied, the voltage of the signal transmission path lowers with the voltage of the VDD1. To prevent this, by causing a reverse current to flow by use of the breakdown of the protective diode comprising the P-type MOSFET Q14, the voltage of the signal transmission path is clamped. While the GND1, VDD2 are open, and if a positive high voltage with respect to the ground potential GND2 is applied to the power supply voltage VDD1, a forward current is made to flow through the protective diode formed with the N-type MOSFET Q15, thereby to clamp the voltage of the signal transmission path. Contrarily, when a negative high voltage is applied to the power supply VDD1, by causing a reverse current through the protective diode comprising the N-type MOSFET Q15 by use of the breakdown of the N-type MOSFET Q15, the voltage in the signal transmission path is clamped. The withstand voltage against electrostatic breakdown of the input MOSFETs Q12 and Q13 is improved by means of the protective resistor R1 for suppressing the sharp change of voltage in the signal transmission path and through the operation of the P-type MOSFET Q14 and the N-type MOSFET Q15.

Figure 8:
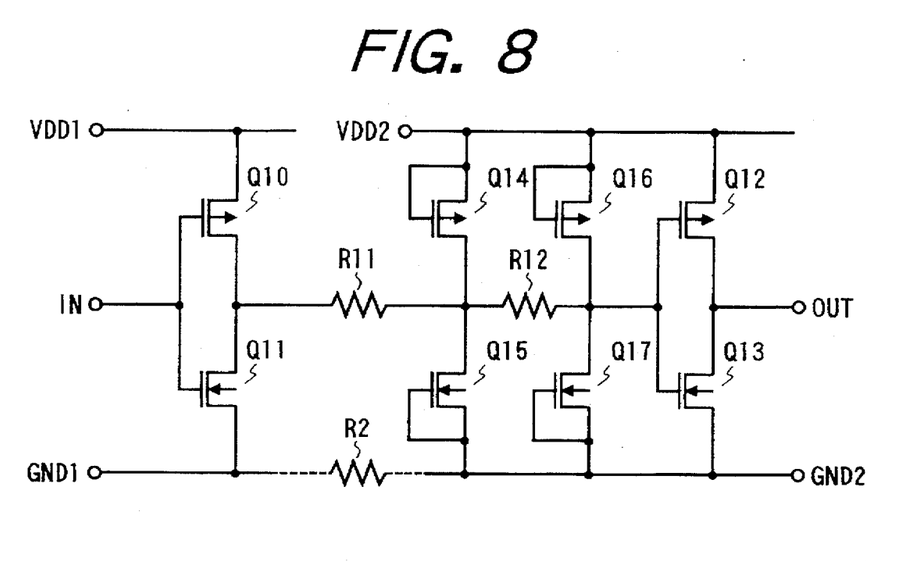
FIG. 8 is a circuit diagram of still another interface embodying the present invention.

FIG. 8 is a circuit diagram of still another interface embodying the present invention. A further improvement in the withstand voltage against electrostatic breakdown is made by providing R11 and R12 as protective resistors, and two stages of Q14, Q15, and Q16, Q17 as protective diodes which are MOSFETs for clamping voltage. If necessary, similar circuits but of three stages may be provided.

Figure 9:
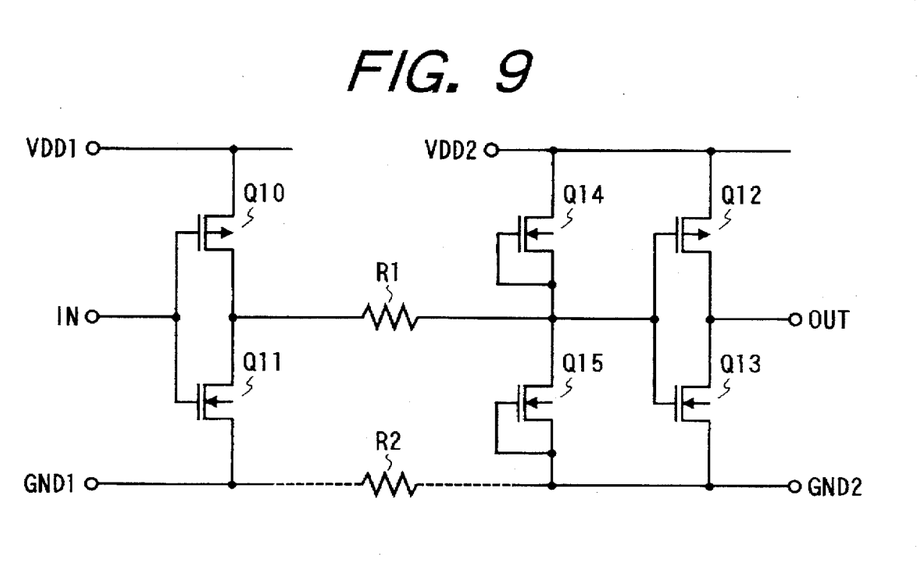
FIG. 9 is a circuit diagram of still another interface embodying the present invention.

FIG. 9 is a circuit diagram of still another interface embodying the present invention. In this embodiment of the present invention, the N-channel MOSFETs Q14 and Q15 are employed as MOSFETs for clamping voltage in the power supply VDD2 system of the input side. In other words, the protective diode that has been formed with the P-channel MOSFET Q is formed with an N-channel MOSFET Q. The clamping MOSFETs Q14, Q15 and the input MOSFETs Q12, Q13 are of single drain structure.

For example, while the GND1, GND2 are open, and if a positive high voltage with respect to the power supply voltage VDD2 is applied to the power supply voltage VDD1, the voltage in the signal transmission path rises with a rise in the voltage of the power supply VDD1. To prevent this, a forward current is made to flow through the protective diode comprising the N-type MOSFET Q14, thereby clamping the voltage of the signal transmission path. Contrarily, when a negative high voltage is applied, the voltage of the signal transmission path lowers with the voltage of the VDD1. To prevent this, by causing a reverse current to flow by use of the breakdown of the protective diode comprising the N-type MOSFET Q14, the voltage of the signal transmission path is clamped. While the GND1, VDD2 are open, and if a positive high voltage with respect to the ground potential GND2 is applied to the power supply voltage VDD1, a forward current is made to flow through the protective diode formed with the N-type MOSFET Q15 thereby to clamp the voltage of the signal transmission path. Contrarily when a negative high voltage is applied to the power supply VDD1, by causing a reverse current through the protective diode comprising the N-type MOSFET Q15 by use of the breakdown of the N-type MOSFET Q15, the voltage in the signal transmission path is clamped. The withstand voltage against electrostatic breakdown of the input MOSFETs Q12 and Q13 is improved by means of the protective resistor R1 for suppressing the sharp change of voltage in the signal transmission path and through the operation of the N-type MOSFET Q14 and the N-channel MOSFET Q15.

Although the effect of the circuit operation above and the withstand voltage against electrostatic breakdown are similar to those in the embodiment shown in FIG. 7, the feature of the interface in this embodiment is the use of only the N-channel MOSFET as a MOSFET for clamping voltage. A parasitic bipolar transistor does not constitute a thyristor since no CMOS is used to constitute the MOSFET for clamping voltage of FIG. 7. Consequently, no latch-up is caused by the MOSFET for clamping voltage, and the elements do not need to be spaced apart. The layout area can thus be reduced in comparison with a case where the CMOS is employed as shown in FIG. 7.

Figure 10:
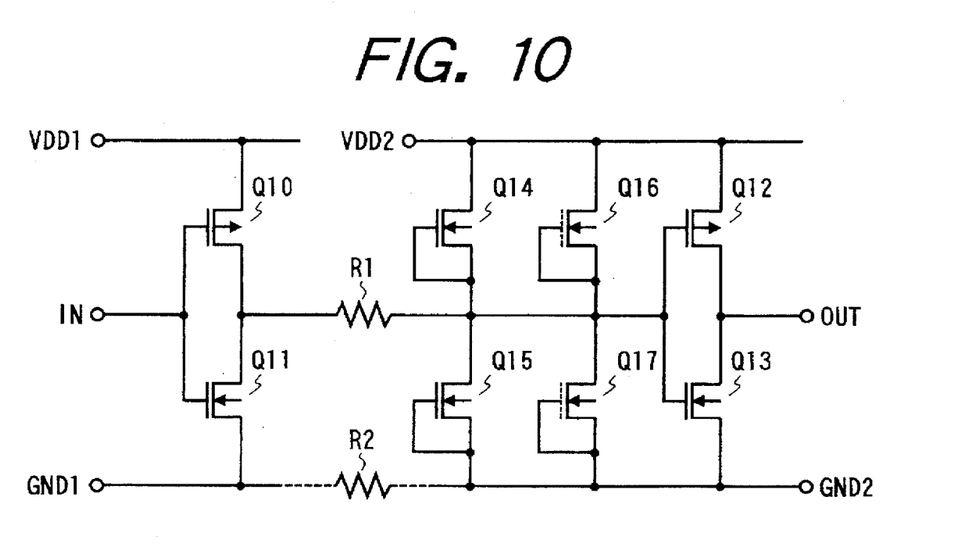
FIG. 10 is a circuit diagram of still another interface embodying the present invention.

FIG. 10 is a circuit diagram of still another interface embodying the present invention. As in the preceding embodiments of the present invention, N-channel MOSFETs Q14 and Q15 are employed as MOSFETs for clamping voltage in the power supply VDD2 system of the input side. In other words, the protective diode that has ben formed with the P-channel MOSFET Q is formed with the N-channel MOSFET Q. The clamping MOSFETs Q14, Q15 and the input MOSFETs Q12, Q13 are of single drain structure. The N-type aluminum parasitic MOSFETs Q16, Q17 are simultaneously used as protective diodes so as to improve the withstand voltage against electrostatic breakdown.

Figure 11:
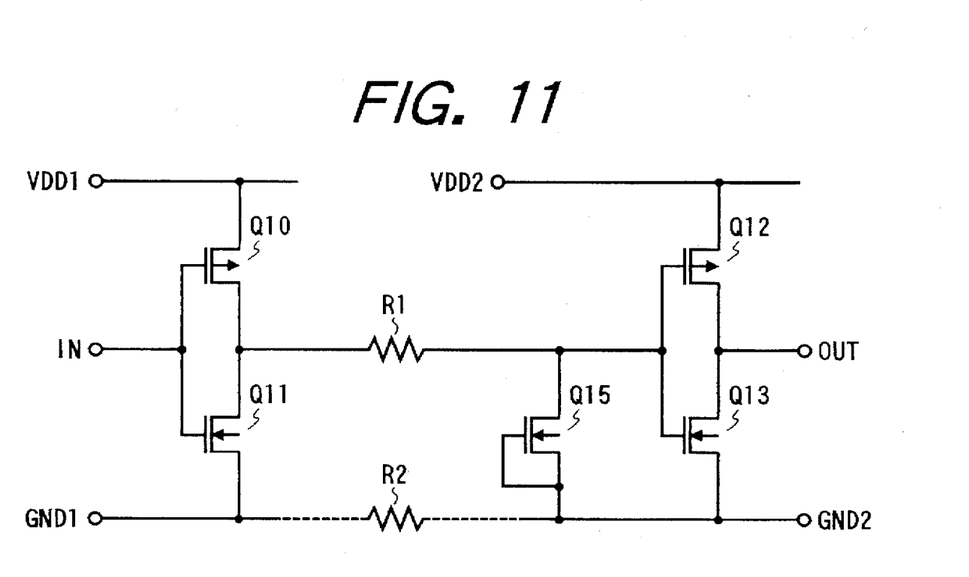
FIG. 11 is a circuit diagram of still another interface embodying the present invention.

FIG. 11 is a circuit diagram of still another interface embodying the present invention. When the power supply voltages are VDD1>VDD2 during the normal operation in this embodiment, the withstand voltage against electrostatic breakdown is improved and the layout area is reduced by connecting the MOSFET for clamping voltage to only the GND2.

The effect of the embodiment is as follows: (1) In a semiconductor integrated circuit comprising a plurality of electronic circuits which are each provided with an interface for effecting signal transmission, and each supplied with operating voltages from a plurality of independent power supply terminals, protective elements, for example, unidirectional elements having such high threshold voltages that the elements are off in the ordinary state of power supply are provided between the power supply terminals, whereby the input MOSFET of the interface is effectively protected even when a high voltage due to static electricity is applied to each power supply terminal at the time of handling the semiconductor integrated circuit because the power supply terminal is discharged by the protective elements. (2) The electronic circuit comprises MOSFETs, and the unidirectional element is a parasitic MOSFET in which the gate insulating film is formed by use of the field insulating film and the gate is connected to the drain. Therefore the unidirectional element is effectively operated only when static electricity is generated without affecting the normal operating condition. (3) In a semiconductor integrated circuit comprising a plurality of electronic circuits which are each provided with an interface for effecting signal transmission, and each supplied with operating voltages from a plurality of independent power supply terminals, a resistor and a diode both for preventing electrostatic breakdown are connected to the gate of the input MOSFET of the interface for transmitting signals between the electronic circuits. Thereby, even when a high voltage due to static electricity is applied to the power supply terminals while the semiconductor integrated circuit is handled, dielectric breakdown of the gate of the input MOSFET of the interface is prevented by an electrostatic breakdown preventive circuit comprising the resistor and the diode. (4) With the progress of semiconductor integrated circuit technology, miniaturization of devices has been progressing. The breakdown voltages of MOSFETs used in internal circuits tend to decrease, and much more electronic circuits tend to be formed on one semiconductor substrate. Consequently, the breakdown of the interfaces between the internal electronic circuits can be prevented by (1) through (3) above. The function and the scale of the semiconductor integrated circuits can be more enhanced.

A detailed description has been given of the invention made by the present inventors through the embodiments thereof. However, the present invention is not restricted to the aforementioned embodiments thereof by may needless to say be modified in various manners without departing the spirit and scope of the invention. For example, independent power supply voltage terminals may be provided so as to avoid noise interference between such electronic circuits as described above. Further, independent power supply voltage terminals may also be provided for each electronic circuit so as to supply different power supply voltages thereto.

Moreover, parasitic diodes may be provided between the independent power supply terminals and protective circuit may also be provided in the interfaces. Since a parasitic diode comprising a drain diffusion layer is provided between the power supply line of the output MOSFET of the interface or the grounding line of the circuit and the substrate, any protective circuit is not particularly required when the substrate and the like are floating. However, a high breakdown voltage element may be used if a high voltage is applied therebetween.

The present invention is widely applicable to various semiconductor integrated circuits having an interface in which a plurality of power supply voltage terminals are provided for some reason, and signals are transferred between electronic circuits supplied with operating voltages through the power supply voltage terminals, like electronic circuits where different power supply voltages are supplied as described above, in addition to digital/analog mixed LSIs as above.

The effect produced by the representatives of the inventions disclosed in the present application is as follows: In a semiconductor integrated circuit comprising a plurality of electronic circuits which are each provided with interfaces for effecting signal transmission, and each supplied with operating voltages from the plurality of independent power supply terminals, unidirectional elements each having high threshold voltages at which the elements are off in the ordinary state of power supply are provided between the power supply terminals, whereby the input MOSFET of the interface is effectively protected even when a high voltage due to static electricity is applied to each power supply terminal while handling the semiconductor integrated circuit because power supply terminal is discharged by the unidirectional elements.

The electronic circuit comprises MOSFETs, and the unidirectional element is a parasitic MOSFET in which the gate insulating film is formed by use of the field insulating film and the gate is connected to the drain. Therefore the unidirectional element is effectively operated only when static electricity is generated without affecting the normal operating condition.

In a semiconductor integrated circuit comprising a plurality of electronic circuits which are each provided with an interface for effecting signal transmission, and each supplied with operating voltages from a plurality of independent power supply terminals, a resistor and a diode both for preventing electrostatic breakdown are connected to the gate of the input MOSFET of the interface for transmitting signals between the electronic circuits. Thereby, even when a high voltage due to static electricity is applied to the power supply terminals while the semiconductor integrated circuit is handled, dielectric breakdown of the gate of the input MOSFET of the interface is prevented by an electrostatic breakdown preventive circuit comprising the resistor and the diode.

With the progress of semiconductor integrated circuit technology, miniaturization of devices has been progressing. The breakdown voltages of MOSFETs used in internal circuits tend to decrease, and much more electronic circuits tend to be formed on one semiconductor substrate. Consequently, breakdown of the interfaces between the internal electronic circuits can be prevented as set forth above, so that the function and the scale of the semiconductor integrated circuit are enhanced.

What is claimed is:

1. A semiconductor integrated circuit comprising:

a semiconductor substrate, a first and a second circuit formed on the semiconductor substrate, a first power supply terminal formed on the semiconductor substrate and used for supplying a first operating voltage to the first circuit, and a second power supply terminal formed on the semiconductor substrate and used for supplying a second operating voltage to the second circuit, first power supply wiring connected to the first power supply terminal and extended in the first circuit, first reference potential wiring extended in the first circuit, second power supply wiring connected to the second power supply terminal and extended in the second circuit, second reference potential wiring extended in the second circuit, a first and a second MOSFET provided in the first circuit and connected in series between the first power supply wiring and the first reference potential wiring, a third and a fourth MOSFET provided in the second circuit and connected in series between the second power supply wiring and the second reference potential wiring, and a signal wiring connected to the first, second and fourth MOSFETs and used for transmitting an output signal of the first circuit to the second circuit, wherein the first and second power supply wirings are electrically independent of each other on the semiconductor substrate, and a resistor element is included in part of the signal wiring, wherein the gate length of the fourth MOSFET is greater than that of the second MOSFET.

2. A semiconductor integrated circuit comprising:

a semiconductor substrate, a first and a second circuit formed on the semiconductor substrate, a first power supply terminal formed on the semiconductor substrate and used for supplying a first operating voltage to the first circuit, and a second power supply terminal formed on the semiconductor substrate and used for supplying a second operating voltage to the second circuit, first power supply wiring connected to the first power supply terminal and extended in the first circuit, first reference potential wiring extended in the first circuit, second power supply wiring connected to the second power supply terminal and extended in the second circuit, second reference potential wiring extended in the second circuit, a first and a second MOSFET provided in the first circuit and connected in series between the first power supply wiring and the first reference potential wiring, a third and a fourth MOSFET provided in the second circuit and connected in series between the second power supply wiring and the second reference potential wiring, and a signal wiring connected to the first, second, third and fourth MOSFETs and used for transmitting an output signal of the first circuit to the second circuit, wherein the first and second power supply wirings are electrically independent of each other on the semiconductor substrate, and a protective element connected between the signal wiring and the second reference potential wiring and used for preventing breakdown of the fourth MOSFET when an overvoltage is applied to the signal wiring, wherein said protective element comprises an N-channel MOSFET, and the gate electrode of the N-channel MOSFET is connected to the second reference potential wiring.

3. A semiconductor integrated circuit as claimed in claim 2, further comprising:

a further protective element connected between the signal wiring and the second power supply wiring.

4. A semiconductor integrated circuit as claimed in claim 3, wherein the further protective element comprises an N-channel MOSFET; and the gate electrode of the MOSFET is connected to the signal wiring.

5. A semiconductor integrated circuit as claimed in claim 3, wherein the further protective element is a P-channel MOSFET; and the gate electrode of the MOSFET is connected to the second power supply wiring.

6. A semiconductor integrated circuit comprising a semiconductor substrate, a first and a second circuit formed on the semiconductor substrate, a first power supply terminal formed on the semiconductor substrate and used for supplying a first operating voltage to the first circuit, and a second power supply terminal formed on the semiconductor substrate and used for supplying a second operating voltage to the second circuit, first power supply wiring connected to the first power supply terminal and extended in the first circuit, first reference potential wiring extended in the first circuit, second power supply wiring connected to the second power supply terminal and extended in the second circuit, second reference potential wiring extended in the second circuit, a first and a second MOSFET provided in the first circuit and connected in series between the first power supply wiring and the first reference potential wiring, a third and a fourth MOSFET provided in the second circuit and connected in series between the second power supply wiring and the second reference potential wiring, and a signal wiring connected to the first, second, third and fourth MOSFETs and used for transmitting an output signal of the first circuit to the second circuit, wherein the first and second power supply wirings are electrically independent of each other on the semiconductor substrate, and a protective element connected between the signal wiring and the second reference potential wiring and used for preventing breakdown of the fourth MOSFET when an overvoltage is applied to the signal wiring, wherein the signal wiring is connected to the third MOSFET, the third MOSFET is a P-channel MOSFET and the fourth MOSFET is an N-channel MOSFET.

7. A semiconductor integrated circuit as claimed in claim 6, wherein the protective element comprises an N-channel MOSFET, and the gate electrode of the MOSFET is connected to the second reference potential wiring.

8. A semiconductor integrated circuit comprising:

a semiconductor substrate, a first and a second circuit formed on the semiconductor substrate, a first power supply terminal formed on the semiconductor substrate and used for supplying a first operating voltage to the first circuit, and a second power supply terminal formed on the semiconductor substrate and used for supplying a second operating voltage to the second circuit, first power supply wiring connected to the first power supply terminal and extended in the first circuit, first reference potential wiring extended in the first circuit, second power supply wiring connected to the second power supply terminal and extended in the second circuit, second reference potential wiring extended in the second circuit, a first and a second MOSFET provided in the first circuit and connected in series between the first power supply wiring and the first reference potential wiring, a third P-channel MOSFET and a fourth N-channel MOSFET provided in the second circuit and connected in series between the second power supply wiring and the second reference potential wiring;

a signal wiring connected to the first, second, third and fourth MOSFETs and used for transmitting an output signal of the first circuit to the second circuit; and a fifth N-channel MOSFET having a gate, a source and a drain, wherein the drain is connected to the signal wiring and the gate and source are connected to the second reference potential, wherein the first and second power supply wirings are electrically independent of each other on the semiconductor substrate.

9. A semiconductor integrated circuit as claimed in claim 8, wherein said fifth N-channel MOSFET has a gate insulating film which has same thickness as that of said fourth MOSFET.

* * * * *